United States Patent [19]

Abstreiter et al.

[11] Patent Number: 4,755,857
[45] Date of Patent: Jul. 5, 1988

[54] HETEROSTRUCTURE SEMICONDUCTOR DEVICE

[75] Inventors: Gerhard Abstreiter, Grenoble, France; Klaus Ploog, Stuttgart; Albrecht Fischer, Loechgau, both of Fed. Rep. of Germany

[73] Assignee: Max-Planck-Gesellschaft zur Foerderung der Wissenschaften e.V., Fed. Rep. of Germany

[21] Appl. No.: 442,719

[22] Filed: Nov. 18, 1982

Related U.S. Application Data

[63] Continuation of Ser. No. 136,321, Apr. 1, 1980, abandoned.

[30] Foreign Application Priority Data

Apr. 2, 1979 [DE] Fed. Rep. of Germany ....... 2913068

[51] Int. Cl.⁴ .............................................. H01L 29/80
[52] U.S. Cl. .................................... 357/22; 357/15
[58] Field of Search .................. 357/16, 4, 30, 23 R, 357/23.2, 15, 23.7

[56] References Cited

U.S. PATENT DOCUMENTS

| | | | |
|---|---|---|---|
| 4,157,556 | 6/1979 | Decker et al. | 357/22 |
| 4,163,237 | 7/1979 | Dingle | 357/16 |
| 4,173,764 | 11/1979 | de Cremoux | 357/22 |
| 4,257,055 | 3/1981 | Hess et al. | 357/16 |
| 4,270,094 | 5/1981 | Holonyak, Jr. | 357/16 X |

OTHER PUBLICATIONS

*Journal of the Electrochemical Society,* Dec. 1978, pp. 487C–499C.

*Primary Examiner*—Martin H. Edlow
*Attorney, Agent, or Firm*—Brumbaugh, Graves, Donohue & Raymond

[57] ABSTRACT

A heterostructure semiconductor device as a Schottky gate field-effect transistor comprises a semiconductor body including first and second layers made of different semiconductor materials, as gallium arsenide and aluminium gallium arsenide. A narrow heterojunction is formed between the layers. The material of the first layer is pure and comprises a minimum of defects. The second layer comprises a doping material, the concentration of which being at least one order of magnitude higher than the concentration of any doping or impurity material present in the first layer. The semiconductor and doping materials are chosen such that the energy levels occupied by the shallow doping material atoms in said second layer have an energetically more unfavorable position than an adjacent of the energy bands of the first layer so that free charge carriers from the doped second layer can migrate in an adjacent region of the first layer. Since the first layer has a low impurity concentration, the mobility of the charge carriers accumulating in the first layer is high, and the region containing the accumulated charge carriers can be used as channel of the field-effect transistor. Semiconductor bodies of the described type can also be used for other semiconductor devices, as opto-electronic devices and integrated circuits.

13 Claims, 3 Drawing Sheets

FIG. 2
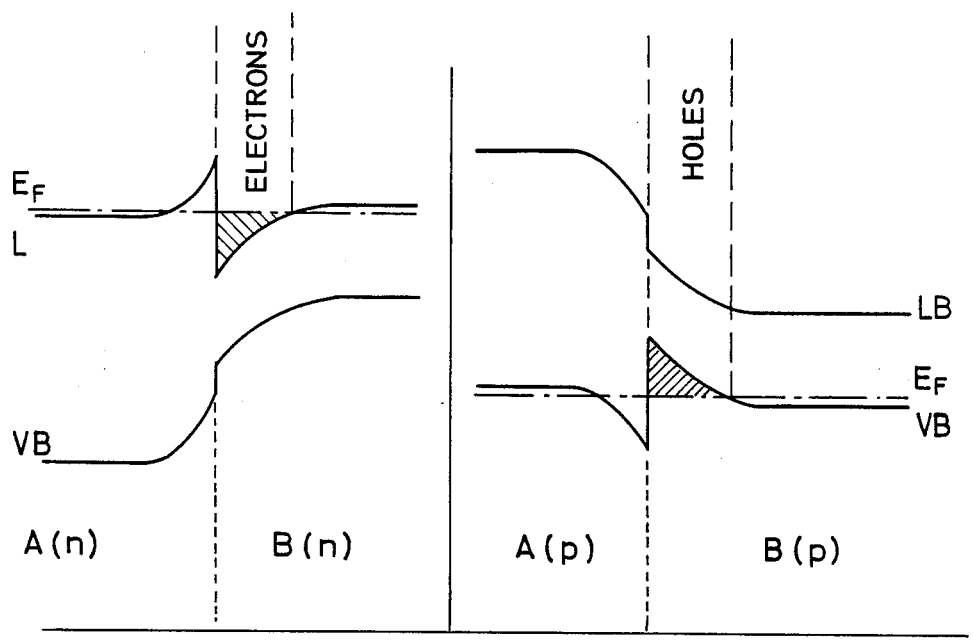
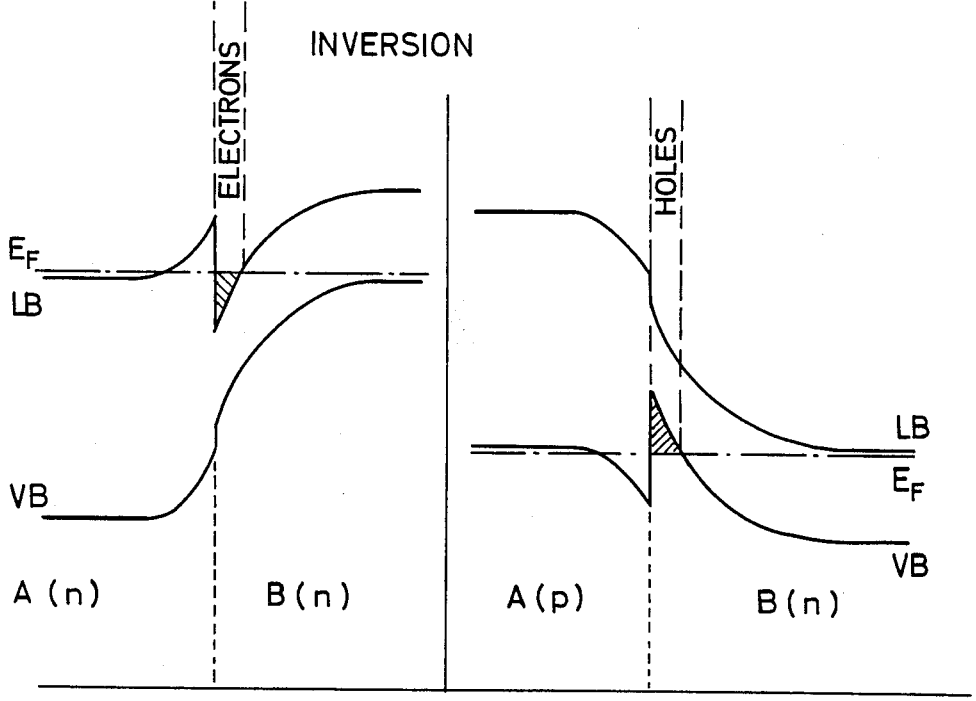

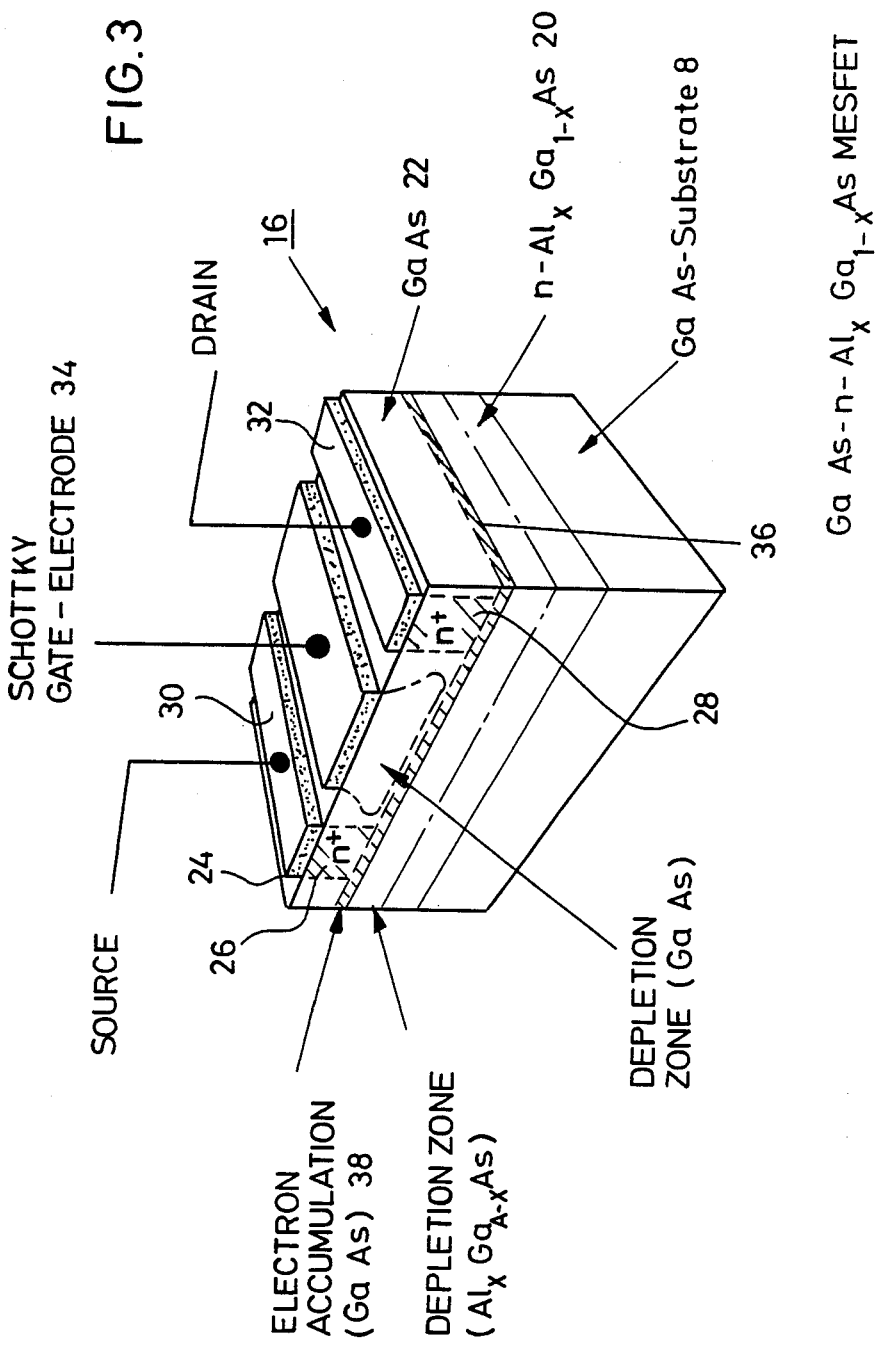

HETEROSTRUCTURE SEMICONDUCTOR DEVICE

This is a continuation of application Ser. No. 136,321, filed Apr. 1, 1980, now abandoned.

BACKGROUND OF THE INVENTION

The present invention relates to semiconductors, specifically to semiconductor bodies and devices comprising layers or zones consisting of different semiconductor materials.

A known high frequency metal-semiconductor field-effect transistor (MES-FET) comprises a semiconductor substrate made of gallium arsenide GaAs onto which a thin (e.g. 0.5 microns) epitaxial layer of gallium arsenide is formed which is relatively heavy doped with a donor material (about $1 \times 10^{17}$ donor atoms per cubic centimeter). The doped epitaxial layer is provided with source and drain contacts, and the portion of the layer between these contacts operates as channel of controllable conductivity. The device further comprises a gate electrode in form of a Schottky contact which is provided on the channel and enables to control the resistance of the channel by carrier depletion. MES-FET devices and other applications of heterostructure-semiconductor bodies are disclosed in the magazine "Journal of the Electrochemical Soceity", December 1978, pp. 478C to 499C.

It is also known to form the doped channel layer of a field-effect transistor of this type in high-resistivity gallium arsenide by ion implantation.

The high-frequency limit of semiconductor devices of the above-described type is mainly limited by the mobility or drift velocity of the charge carriers in the semiconductor material, and the length of the channel. Thus, assuming a given geometry of the device, it is desirable to increase the mobility of the charge carrier. One known solution for this task is to use other compound semiconductors than gallium arsenide, as InP or $Ga_xIn_{1-x}P_yAs_{1-y}$ which have higher carrier mobilities than gallium arsenide.

A factor which limits the mobility of the charge carrier in semiconductor devices of the above-identified type and which is independent of the type of semiconductor material used, is the large number of charged impurities in the current-carrying channel.

SUMMARY OF THE INVENTION

It is an object of the present invention to provide a new way for increasing the charge carrier mobility in a heterostructure semiconductor body or device.

A heterostructure semiconductor body is provided which comprises two layers of different, crystaline semiconductor materials. Each of said semiconductor materials has valence and conduction energy bands separated by a band gap (forbidden zone).

According to the invention, the first layer, which is an epitaxial surface layer on the second layer, is comprised of a semiconductor material which has a smaller band gap than the material of the second layer.

The second layer is doped with a conductivity-determining doping material, the doping material concentration in said second layer being at least one order of magnitude larger than the concentration of any doping material present in the first layer.

The semiconductor and doping materials are chosen such that the energy levels of the doping material atoms in the second layer have an energetically more unfavorable position than an adjacent of the energy bands of the first layer, so that charge carriers migrate from the doped second layer into an adjacent region of first layer. The first layer should be as pure and as undisturbed as possible so that the mobility of the accumulated charge carriers is not impaired by charged impurities and defects in the mentioned region of the first layer.

The mobility of the charge carriers is increased in the heterostructure semiconductor bodies and devices according to the invention because the charge carriers are transferred from the relatively heavily doped semiconductor material of the larger band gap into the less doped semiconductor material having the smaller band gap. Since the semiconductor material having the smaller band gap is more pure, the mobility of the charge carriers is less impaired by charged impurities and other defects than in the more heavily doped second layer.

The heterostructure semiconductor bodies according to the invention are especially well suited for semiconductor devices, as opto-electronic devices, field-effect semiconductor devices, high-frequency devices, as microwave field-effect transistors. The semiconductor bodies according to the invention can also be used as substrates or semiconductor bodies for integrated circuits including integrated opto-electronic circuits.

BRIEF DESCRIPTION OF THE DRAWINGS

FIG. 2 shows further energy diagrams of embodiments of heterostructures semiconductor bodies according to the invention, and FIG. 3 is a perspective sectional view of a metal semiconductor field-effect transistor according to a preferred embodiment of the invention.

DESCRIPTION OF THE PREFERRED EMBODIMENTS

Figure 1:
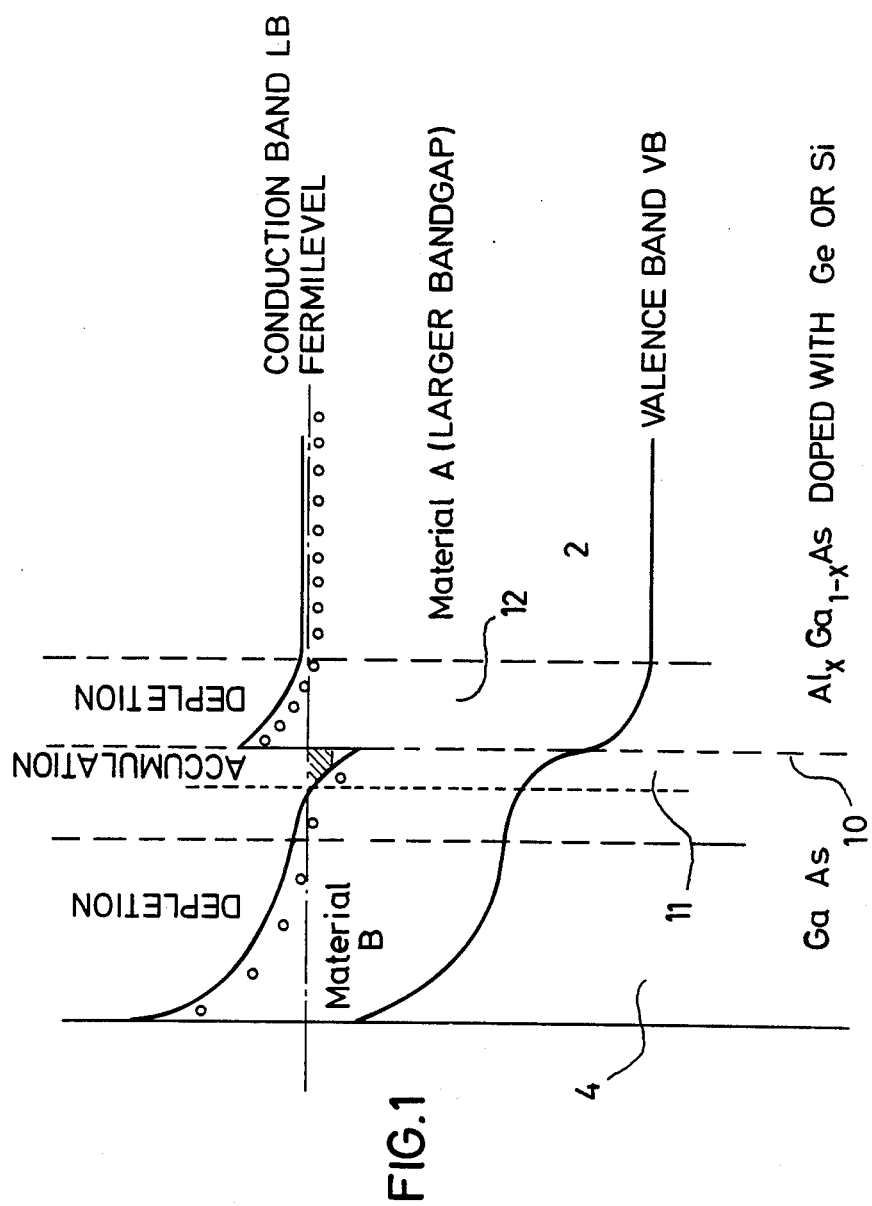
FIG. 1 shows an energy diagram of an embodiment of a heterostructure semiconductor body in the unbiased state.

A heterostructure semiconductor body according to an embodiment of the invention comprises two zones or layers of different semiconductor materials A and B, respectively, each having energy bands separated by a band gap or forbidden zone. The band gaps of the two semiconductor materials are different. The semiconductor material A has the relatively larger band gap, and is heavily doped. The semiconductor material B has the relatively smaller band gap and is less heavily doped or not doped at all, it is in any case essential that the concentrations of the doping or impurity materials in the semiconductor material having the smaller band gap is at least one order to magnitude smaller than the doping or impurity concentration in the semiconductor material having the larger band gap.

The semiconductor and doping materials are chosen such that the energy levels of the doping material atoms (which may be donors or acceptors) have an energetically more unfavourable position than the conduction band (in the case of donors) or the valence band (in the case of acceptors) of the second semiconductor material B.

In case that the second layer material A is doped with a donor material, the energy levels of the shallow donors within the semiconductor material A are energetically positioned above the conduction band of the semiconductor material B. Thus, electrons are separated from the donor atoms and migrate into the adjacent semiconductor material B. This causes a bending of the energy bands as shown in FIG. 1, and the semiconductor material A is depleted of electrons adjacent to a junction zone 10 between the semiconductor materials A,B, while the charge carriers (electrons) accumulate in the semiconductor material B adjacent to the junction or transition zone 10.

FIG. 1 shows a typical configuration of the valence and energy bands in the semiconductor materials A and B for the case that the semiconductor material A is comprised of $Al_xGa_{1-x}As$ and doped with germanium and/or silicon, and the semiconductor material B is comprised of pure GaAs.

In case that the semiconductor material A is P-type doped with acceptors, an electron-inversion layer is formed instead of the electron accumulation layer. The conditions for the case of acceptors and holes (defect electrons) can be described in an analogous manner.

FIG. 2 shows schematically the configuration of the combination band LB and the valence band VB of four different heterostructure semiconductor bodies consisting of a heavily doped semiconductor material A having a relatively large band gap, and a relatively lightly doped or not doped at all semiconductor material B having a relatively small band gap. $E_F$ is the Fermi level. If the type of the free charge carriers (majority charge carriers) is the same in both materials (n-type or p-type) an accumulation layer of majority charge carriers (electrons or holes) is produced in the semiconductor material B. In case of different signs of the charge carriers in the materials A and B, an inversion layer is formed. The details of the behavior of the energy bands depends on the discontinuity of the energy bands at the interface or junction. In the system $Al_xGa_{1-x}As$/GaAs, about 80% of the difference between the band gap sizes of the materials is compensated in the conduction band. This system is therefore well suited for devices in which an electron accumulation or electrons inversion layer within the GaAs is desired. For corresponding channels comprising holes (defect electrons), materials with a large step in the valence bands are suited. GaAs/Ge is an example of such a system. In this system, holes migrate from the p-doped material A (in this case GaAs) into the material B with the smaller band gap (i.e. Ge). In the case of p-type germanium, a hole accumulation layer is obtained, while in the case of n-type germanium, a hole inversion layer is obtained. In any case, the essential advance is obtained that the charge carriers migrate from the material A into the material B and therefore become spatially separated from the acceptors or donors contained in the material A. The charge carriers which are present in the material B adjacent the junction zone 10 or interface form a quasi-two dimensional channel 11 similar to the inversion layer in a silicon MOS transistor. The channel 11, which comprises the charge carriers, is electrically insulated from the heavily doped material A by the depletion layer 1 which is simultaneously formed within the material A.

An essential condition for the formation of a channel, which comprises charge carriers having high mobility, is that the transition from the first semiconductor material to the second semiconductor material and the doping material concentration are very abrupt, preferably only a few and no more than about 10 atomic layers, so that the density of the interface-states is much lower than the density of the charge carriers transferred from material A into material B. Further, the interface or junction zone itself should be as planar as possible in an atomic scale so that no interface roughness is present, which may spoil by scattering of charge carriers the benefit of the enhanced mobility achieved by the purity of the material B.

A difference of only about an order of magnitude (power of ten) between the doping material concentrations in the purer, smaller band gap material, and the more heavily doped, larger band gap material is generally sufficient to obtain the desired effect (higher mobility), however, this advantage is of course as more pronounced as larger the difference or as purer the smaller band gap semiconductor material is. The first semiconductor material may comprise about $5 \cdot 10^{13}$ to about $1 \cdot 10^{17}$ impurity atoms per cubic centimeter, for example. The larger band gap semiconductor material A preferably comprises e.g. about $5 \cdot 10^{16}$ to $5 \cdot 10^{18}$ charge carriers or ionizable impurities of a predetermined conductivity type per cubic centimeter. A typical, preferred value is $5 \cdot 10^{17}$ cm$^{-3}$. In practice the material B is never completely pure, especially if it is comprised of a compound semiconductor, as an $A_{III} B_V$ compound, typical concentrations of the remaining impurities in this material are about $5 \cdot 10^{13}$ to $1 \cdot 10^{15}$ per cubic centimeter.

The semiconductor body may further comprise a substrate in addition to the above-mentioned first and second layers made of materials B and A, respectively. The substrate may be formed by a portion of the semiconductor material having the larger band gap. However, the smaller band gap material B should always form some kind of surface layer, one side being in contact with the doped semiconductor material A and the other surface being contiguous to the surrounding air and/or metal contacts and/or an inactive protection or passivation or insulating layer. Generally, the first layer made of the semiconductor material B will be thinner than the second layer made of the doped semiconductor material A.

FIG. 3 shows a preferred embodiment of a field-effect transistor which comprises a new semiconductor body of the above-described type. The microwave transistor 16 functions similar to a usual Schottky-gate MESFET. The transistor 16 includes a substrate 8 made of GaAs onto which a n-type layer 20 of aluminum gallium arsenide $Al_xGa_{1-x}As$ and a layer 22 of extremely pure gallium arsenide are formed in the order named, the layer 22 forming a first surface 24 of the semiconductor body. Two n+-type zones 26 and 28 are diffused into the gallium arsenide layer 22, which form source and drain zones, respectively, and are each provided with an appropriate ohmic metal contact 30 and 32, respectively. Further, a gate electrode 34 is formed on the surface 22 of the gallium arsenide layer 22, said electrode 34 forming a Schottky-type contact with the layer 22. The layer 22 may be provided with a protection or passivating or insulating layer (not shown) consisting of e.g. an oxide or a nitride.

The thickness of the gallium arsenide layer 22 is preferably chosen such that the depletion layer, which is formed by the Schottky contact under zero bias conditions ($V_g = 0$) extends as far as the enrichment or inversion channel which is formed at the interface or junction 36 between the layers 20 and 22, without cutting off the channel, so that the channel remains open or conductive. If now a reverse bias is applied to the Schotty contact via the gate electrode 34, the charge carriers at the junction 36 are withdrawn until the channel is eventually cut off. Since it is not necessary to produce a depletion layer to cut off the channel and since the charge carriers have a high mobility, the channel can be cut off very quickly, i.e. within about $10^{-12}$ seconds.

The semiconductor bodies according to the invention can be manufactured e.g. by molecular beam epitaxy or metalorganic chemical vapor deposition. A preferred semiconductor system is GaAs/Al$_x$Ga$_{1-x}$As. The band gap of the aluminium gallium arsenide is larger than that of gallium arsenide. A suitable doping material which allows an abrupt change of the doping material concentration (abrupt junction zone) is e.g. germanium or silicon. x may have values between 0.10 to 0.35. The concentration of the silicon or germanium in the Al$_x$Ga$_{1-x}$As is preferably between about $5 \cdot 10^{16}$ to $5 \cdot 10^{18}$ per cubiccentimeter.

Other useful semiconductor material combinations are set forth in the following table:

TABLE

| Material A (second layer 2) | Doping material | Material B (First layer 4) |
|---|---|---|
| Ge | Acceptors | GaAs |
| Ga$_{1-x}$Tm$_x$As | Donors | GaAs |
| GaAs$_y$Sb$_{1-y}$ | Acceptors | GaAs |

A semiconductor device incorporating the new semiconductor body of the type described above will comprise at least two contacts. Each of the first and second layers may be provided with one such contact. Further a plurality of contacts may be provided on the first layer made of the semiconductor material B, as ohmic and/or Schottky contacts. The substrate can also be provided with an electric connection. The contacts may comprise doped zones.

Further embodiments and modifications will occur to those skilled in the art.

We claim:

1. A field effect transistor device comprising:
   a source electrode;
   a drain electrode;
   a first single layer of a first semiconductor material providing the sole conductive current channel between the source and drain electrodes;
   a second layer of a second semiconductor material having a larger bandgap and a doping concentration at least one order of magnitude larger than any doping in the first semiconductor material and which has charge carriers occupying an energy level less favorable than the adjacent energy levels of the first semiconductor material so as to allow charge carriers from the second layer to migrate into an adjacent region of the first layer;
   the first layer comprising an epitaxial layer on the second layer and forming a narrow semiconductor heterojunction therewith; and
   a Schottky contact gate electrode on the surface of the first layer opposite to the heterojunction and normally providing a depletion zone extending close to the heterojunction without entirely cutting off the sole conductive current channel provided by the first layer,
   whereby application of a reverse bias potential to the Schottky contact gate electrode is effective to cut off the sole conductive current channel more rapidly than in a layer having uniformly distributed carriers.

2. The device as claimed in claim 1 wherein said first semiconductor material contains about $5 \cdot 10^{13}$ to about $1 \cdot 10^{17}$ impurity atoms per cubic centimeter and said second semiconductor material contains between $5 \cdot 10^{16}$ and $5 \cdot 10^{18}$ ionizable impurity atoms per cubic centimeter.

3. The device as claimed in claim 1 wherein said layers are crystalline and the distance between said heterojunction and the opposed surface of said first layer is smaller than the distance between said heterojunction and the opposed surface of said second layer.

4. The device as claimed in claim 1 wherein said layers comprise different A$_{III}$B$_V$ compounds.

5. The device as claimed in claim 4 wherein said first layer consists essentially of gallium arsenide and said second layer consists essentially of gallium aluminium arsenide.

6. The device as claimed in claim 5 wherein said doping material contained in said second layer includes at least one of the elements silicon and germanium.

7. A device as claimed in claim 1 characterized in that said first layer consists essentially of gallium arsenide.

8. The device as claimed in claim 7 characterized in that said second layer consists of a material selected from the group of materials germanium, gallium arsenide antimonide, and gallium indium arsenide.

9. The device as claimed in claim 1 characterized in that said first semiconductor material is gallium arsenide, said second semiconductor material is gallium arsenide antimonide, and said second layer contain an acceptor material as doping material.

10. The device as claimed in claim 1 wherein said first semiconductor material is gallium arsenide, said second semiconductor material is gallium indium arsenide, and said doping material comprised in said second layer is a donor material.

11. The device as claimed in claim 1 wherein said heterojunction has a thickness of a few atomic layers.

12. The device as claimed in claim 1 wherein said first layer consists of essentially pure semiconductor material.

13. An active semiconductor device with high electron mobility comprising:
   a source layer of a semiconductor doped with donor impurities;
   a channel layer of a semiconductor having a larger electron affinity than the semiconductor of the source layer and forming a heterojunction with said source layer, wherein a channel is formed in said channel layer along said heterojunction;
   at least one control terminal formed on said channel layer over said portion of said heterojunction;
   a pair of output terminals selectively formed on said channel layer, on opposite sides of said at least one control terminal;
   said channel layer having sufficiently small thickness, at least under said at least one control terminal, so as to be substantially entirely depleted of majority carriers under said at least one control terminal;
   wherein said output terminals are electrically connected, at least under said at least one control terminal, only by an accumulation of electrons with high mobility in said channel in said channel layer, depending on a control voltage applied to said control terminal.

* * * * *